US006560728B2

(12) United States Patent
Merritt

(10) Patent No.: US 6,560,728 B2
(45) Date of Patent: May 6, 2003

(54) LAYOUT FOR SEMICONDUCTOR MEMORY DEVICE HAVING A PLURALITY OF ROWS AND COLUMNS OF CIRCUIT CELLS DIVIDED INTO FIRST AND SECOND PLANES THAT ARE NOT SIMULTANEOUSLY ACTIVE

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 09/747,352

(22) Filed: Dec. 19, 2000

(65) Prior Publication Data

US 2001/0016893 A1 Aug. 23, 2001

Related U.S. Application Data

(60) Continuation of application No. 09/415,472, filed on Oct. 8, 1999, now Pat. No. 6,163,860, which is a continuation of application No. 08/911,669, filed on Aug. 14, 1997, now Pat. No. 6,018,811, which is a division of application No. 08/637,875, filed on Apr. 25, 1996, now Pat. No. 5,706,292.

(51) Int. Cl.$^7$ .............................................. G11C 29/00
(52) U.S. Cl. ...................................... 714/711; 714/710
(58) Field of Search ................... 250/208.1; 365/225.7, 365/185.25, 200; 714/711, 710, 733, 742

(56) References Cited

U.S. PATENT DOCUMENTS

| 4,389,715 A | | 6/1983 | Eaton, Jr. et al. ............ 365/200 |
|---|---|---|---|
| 4,471,472 A | | 9/1984 | Young ......................... 365/200 |
| 4,573,146 A | | 2/1986 | Graham et al. .............. 365/200 |
| 4,601,019 A | | 7/1986 | Shah et al. .................. 365/200 |
| 4,837,747 A | | 6/1989 | Dosaka et al. ................ 371/10 |
| 5,083,016 A | * | 1/1992 | Wyles et al. .............. 250/208.1 |
| 5,257,229 A | | 10/1993 | McClure et al. ............. 365/200 |
| 5,270,974 A | | 12/1993 | Reddy ......................... 365/200 |
| 5,295,102 A | | 3/1994 | McClure ..................... 365/200 |
| 5,299,164 A | | 3/1994 | Takeuchi et al. ............. 365/201 |
| 5,303,192 A | | 4/1994 | Baba ........................... 365/200 |
| 5,307,316 A | | 4/1994 | Takemae ..................... 365/200 |
| 5,353,253 A | | 10/1994 | Nakajima .................... 365/200 |
| 5,355,340 A | | 10/1994 | Coker et al. ................. 365/200 |
| 5,377,146 A | | 12/1994 | Reddy et al. ................. 365/200 |
| 5,381,370 A | | 1/1995 | Lacey et al. ................. 365/200 |
| 5,396,124 A | | 3/1995 | Sawada et al. ................. 326/13 |
| 5,430,679 A | | 7/1995 | Hiltebeitel et al. .......... 365/200 |

(List continued on next page.)

FOREIGN PATENT DOCUMENTS

EP 0 577 106 A2 1/1994

OTHER PUBLICATIONS

"FPM DRAMs," *DRAM Data Book*, Chapter 2, Micron Technology, Inc., pp. 2–1 to 2–14, 1995.

*Primary Examiner*—David Ton
(74) *Attorney, Agent, or Firm*—Dorsey & Whitney LLP

(57) ABSTRACT

The present invention reduces the area on a die required for rows and columns of redundant memory cells by sharing compare circuitry with banks of redundant memory cells based on division of the primary memory array into two or more "planes." Pass gates or multiplexers coupled between at least two banks of fuses and one compare circuit selectively couple the appropriate fuse bank to the compare circuit. Preferably, a bit in the address (e.g., address bit RA9 in a row address word having address bits A0–RA9) is received by and controls the multiplexer to select between the two banks of fuses. Additionally, the planes span blocks of memory in the memory array, where each block is divided by shared sense amplifiers. As a result, while eight lines are coupled to 16 rows or columns, only eight rows or columns will be active at any one time because isolation gates will enable only eight of the 16 rows or columns within two planes of memory. As a result, the present invention saves on the number of lines required to intercouple the compare circuits to the redundant rows/columns.

24 Claims, 8 Drawing Sheets

U.S. PATENT DOCUMENTS

| | | | |
|---|---|---|---|
| 5,446,693 A | 8/1995 | Okamoto | 365/200 |
| 5,455,798 A | 10/1995 | McClure | 365/200 |
| 5,491,664 A | 2/1996 | Phelan | 365/200 |
| 5,528,539 A | 6/1996 | Ong et al. | 365/200 |
| 5,537,665 A | 7/1996 | Patel et al. | 395/182.03 |
| 5,574,729 A | 11/1996 | Kinoshita et al. | 371/10.3 |
| 5,577,050 A | 11/1996 | Bair et al. | 371/10.2 |
| 5,602,786 A | 2/1997 | Pascucci et al. | 365/200 |
| 5,617,365 A | 4/1997 | Horiguchi et al. | 365/200 |
| 5,659,509 A | 8/1997 | Golla et al. | 365/200 |
| 5,691,945 A | 11/1997 | Liou et al. | 365/200 |
| 5,734,617 A * | 3/1998 | Zheng | 365/225.7 |
| 5,768,193 A * | 6/1998 | Lee et al. | 365/185.25 |
| 5,790,462 A | 8/1998 | McClure | 365/200 |
| 5,809,225 A | 9/1998 | Ohsawa et al. | 395/183.08 |
| 5,822,256 A * | 10/1998 | Bauer et al. | 365/200 |

\* cited by examiner

LAYOUT FOR SEMICONDUCTOR MEMORY DEVICE HAVING A PLURALITY OF ROWS AND COLUMNS OF CIRCUIT CELLS DIVIDED INTO FIRST AND SECOND PLANES THAT ARE NOT SIMULTANEOUSLY ACTIVE

CROSS REFERENCE RELATED APPLICATIONS

This application is a Continuation of U.S. patent application Ser. No. 09/415,472, filed Oct. 8, 1999, now U.S. Pat. No. 6,163,860, which is a Continuation of U.S. patent application Ser. No. 08/911,669, filed Aug. 14, 1997, now U.S. Pat. No. 6,018,811, which is a Divisional of U.S. patent application Ser. No. 08/637,875, filed Apr. 25, 1996, now U.S. Pat. No. 5,706,292.

TECHNICAL FIELD

The present invention relates to an apparatus and method for testing semiconductor electrical devices, particularly memory devices.

BACKGROUND OF THE INVENTION

Testing is performed on semiconductor devices to locate defects and failures in such devices, typically occurring during the manufacture of the semiconductor devices. As circuit density on semiconductor devices increases, the number of defects and failures can increase. Semiconductor manufacturers, therefore, have an increasing need to detect defects and failures in semiconductor devices as circuit density increases.

Thus, for quality control of semiconductor devices, semiconductor devices are tested, often before a die containing the semiconductor device is packaged into a chip. A series of probes on a test station electrically contact pads on each die in a wafer to access portions of the individual semiconductor devices on the die. For example, in a semiconductor memory device, the probes contact address pads and data input/output pads to access selected memory cells in the memory device. Typical dynamic random access memory devices ("DRAM") include one or more arrays of memory cells that are each arranged in rows and columns. Each array of memory cells includes word or row lines that select memory cells along a selected row, and bit or column lines (or pairs of lines) that select individual memory cells along a row to read data from, or write data to, the cells in the selected row.

During testing, predetermined data values are typically written to selected row and column addresses that correspond to certain memory cells, and then the voltage values are read from those memory cells to determine if the data read matches the data written to those addresses. If the read data does not match the written data, then the memory cells at the selected addresses likely contain defects and the semiconductor device fails the test.

Nearly all semiconductor devices, particularly memory devices, include redundant circuitry on the semiconductor device that can be employed to replace malfunctioning circuits found during testing. By enabling such redundant circuitry, the device need not be discarded even if it fails a particular test. For example, memory devices typically employ redundant rows and columns of memory cells so that if a memory cell in a column or row of the primary memory array is defective, then an entire column or row of redundant memory cells can be substituted therefor, respectively.

Substitution of one of the spare rows or columns is conventionally accomplished by opening a specific combination of fuses (or closing antifuses) in one of several fuse banks on the die. Conventional fuses include polysilicon fuses which can be opened by a laser beam, and also avalanche-type fuses and antifuses. If a given row or column in the array contains a defective memory cell, then the wafer can be moved to another station where a laser blows a fuse to enable a redundant row or column.

The laser blows a selected combination of fuses to provide an address equal to the address of the defective cell. For example, if the defective cell has an eight-bit binary address of 11011011, then the laser blows the third and sixth fuses in a set of eight fuses within one of several fuse banks, thereby storing this address. A compare circuit compares each incoming address to the blown fuse addresses stored in the fuse banks to determine whether the incoming address matches with one of the blown fuse addresses. If the compare circuit determines a match, then it outputs a match signal (typically one bit) to a controller or "phase generator" in a row or column decoder for the memory device. In response thereto, the row or column decoder causes the appropriate redundant row/column to be accessed for data transfer, and ignores the defective row or column in the primary memory array.

The rows and columns of redundant memory cells necessarily occupy space on the die. Moreover, the compare circuitry necessary for accessing the redundant row or column requires space on the die. Compare circuits typically employ multiple exclusive OR gates which require a greater amount of area than other logic gates such as NAND and NOR gates. At least one compare circuit is required for each bank of fuses.

Furthermore, fuses/antifuses and compare circuits are typically located at the periphery of the primary memory array. As a result, lines must be routed from the compare circuits to the redundant rows and columns. These additional lines further take up area on the die. If the compare circuits and fuses were located adjacent to their respective redundant rows or columns, the complexity of the layout of the memory device will increase, which is undesirable.

Semiconductor circuit designers strive to provide greater circuit density on a die of a given size. The die size is typically a size standardized by the semiconductor industry. By providing additional circuitry on a given die, the product incorporating the die is able to provide enhanced or superior performance over competing products in the marketplace. Therefore, there is a need to reduce the area on the die required for redundant rows and columns.

Semiconductor circuit designers have attempted to reduce the number of redundant rows and columns (and their associated circuitry and lines), and thereby free up precious area on the die for additional circuitry to enhance the performance or functionality of the circuitry on the die. However, by so reducing the number of redundant rows and columns, an insufficient number of redundant rows and columns may exist, so that the entire die must be discarded.

An additional problem with reducing the number of redundant memory elements relates to dividing the primary memory array into sub-arrays. Current memory devices divide the primary array of memory cells into sub-arrays so that only a portion of the memory need be energized in a given access, resulting in significant power reduction. Each sub-array requires its own redundant rows and columns. By dividing the memory array into two sub-arrays or "planes," the redundant rows and columns in the first plane can be substituted for any defective row or column in the primary rows/columns of memory cells in the first plane. Although the memory array could be further divided into a greater number of planes (e.g., four) to further reduce power consumption, then an even fewer number of redundant rows and columns can be employed to replace defective rows and columns in one-fourth of the primary memory array. If a greater number of errors occurred within one quarter of the memory array, then an insufficient number of redundant rows/columns will be available to compensate for such defects. Alternatively, no planes could be employed so that all of the redundant rows and columns can be used to replace defective rows and columns throughout the memory anywhere throughout the memory array. However, such a scheme requires a greater number of routing lines as compared to dividing the array into two planes.

One known 1-megabit×4 DRAM device, manufactured by Micron Technology, employs a 2:1 multiplexer to selectively couple a row address fuse bank and a column address fuse bank with one compare circuit. Row addresses and column addresses are typically compared by compare circuits to column and row fuse addresses at different times during read/write cycles in a semiconductor memory device. As a result, at no time will the compare circuit be required to compare an address to both a column address stored in one fuse bank and a row address stored in another fuse bank. Consequently, this known 1-megabit×4 DRAM device employs one compare circuit for every two fuse banks by employing a 2:1 multiplexer. Since 2:1 multiplexers employ, at a minimum, two pass gates, while compare circuits employ exclusive OR gates, 2:1 multiplexers require substantially less die area than compare circuits. Therefore, by reducing the number of compare circuits, this prior 1-megabit×4 DRAM device reduces the area on a die. However, there is still a need to further reduce the area on the die.

Semiconductor circuit designers have attempted to reduce the overall number of redundant rows/columns to thereby increase die area by experimenting with improved manufacturing techniques to reduce the number of defects on such dies, to thereby afford them the ability to reduce the number of redundant rows and columns necessary to compensate for defects. However, as circuit densities increase, defects tend to increase, despite the best improvements in manufacturing techniques.

SUMMARY OF THE INVENTION

The present invention further reduces the area on a die required for rows and columns of redundant memory cells by sharing compare circuitry with banks of redundant memory cells based on division of the primary memory array into two or more "planes." Pass gates or multiplexers coupled between at least two banks of fuses and one compare circuit selectively couple the appropriate fuse bank to the compare circuit. Preferably, a bit in the address (e.g., address bit RA9 in a row address word having address bits A0–A10 is received by and controls the multiplexer to select between the two banks of fuses. As a result, only one compare circuit is required for two fuse banks for a redundant row and a redundant column, and also for a pair of redundant row and columns for each plane.

Additionally, the present invention reduces the number of lines coupled between the compare circuits and the rows and columns of redundant memory elements in the memory array. The present invention maps or assigns groups or planes of memory elements into preferably one of two planes. The planes span between blocks of memory in the memory array, where each block is divided by shared sense amplifiers. As a result, while eight lines are coupled to 16 rows or columns, only eight rows or columns will be active at any one time because isolation gates will enable only eight of the 16 rows or columns within two planes of memory. Consequently, the present invention saves on the number of lines required to intercouple the compare circuits to the redundant rows/columns, thereby realizing increased area on the chip for additional circuitry. Additionally, at no time will both blocks of memory on opposite sides of the shared sense amplifier ever be simultaneously energized. Even with the most compressed address testing, no rows or columns on opposite sides of shared sense amplifiers will be energized. Therefore, the layout of memory cells under the present invention will not interfere with even the most compressed address mode testing of the semiconductor memory device.

In a broad sense, the present invention embodies a semiconductor device having a plurality of primary and redundant circuit elements, control and addressing circuitry, at least first and second sets of fuse banks, and a number of electrically conductive intercoupling lines. The plurality of primary circuit elements are addressable by electrically conductive row and column lines based on an external address word having a predetermined bit length. The plurality of primary and redundant circuit elements are divided into at least first and second sets, wherein circuit elements in the first and second sets are not simultaneously active. The first set of redundant elements can substitute for defective circuit elements in the first set of primary circuit elements, and the second set of redundant circuit elements can substitute for defective circuit elements in the second set of primary circuit elements. The redundant circuit elements are divided into at least a plurality of columns.

The control and addressing circuitry is coupled to the electrically conductive row and column lines and permits communication with a plurality of primary circuit elements based on the external address word supplied thereto. The first and second sets of fuse banks store addresses of defective circuit elements in the first and second sets of primary circuit elements, respectively. The number of electrically conductive intercoupling lines is equal to a number of columns of redundant circuit elements in the first set of redundant circuit elements. The intercoupling lines are coupled to the first and second sets of fuse banks and to both the first and second sets of redundant circuit elements.

The present invention also embodies a semiconductor device including a plurality of primary and redundant circuit elements, control and addressing circuitry, at least first and second sets of fuse banks, at least one comparison circuit, and at least one gating circuit. The plurality of primary circuit elements are addressable by electrically conductive row and column lines based on an external address word having a predetermined bit length. The plurality of primary and redundant circuit elements are divided into at least first and second sets wherein circuit elements in the first and second sets are not simultaneously active. The first and second sets of redundant circuit elements can substitute for defective circuit elements in the first and second sets of primary circuit elements, respectively. The redundant circuit elements are divided into at least a plurality of columns.

The control and addressing circuitry is coupled to the electrically conductive row and column lines, and permit communication with the plurality of primary circuit elements based on the external address word supplied thereto. The first and second sets of fuse banks store addresses of defective circuit elements in the first and second sets of primary circuit elements, respectively. The comparison circuit is coupled to the control and addressing circuit and to the first and second sets of circuit elements. The comparison circuit compares the external address word to the stored addresses in either the first or second fuse banks, and outputs a match signal to access one of the columns of redundant circuit elements if the address word and one of the stored addresses correlate. The gating or multiplexing circuit is coupled between the comparison circuit and the first and second fuse banks. The gating circuit receives at least one bit of the address word and selects, based thereon, one of the first and second fuse banks to couple to the comparison circuit.

The present invention solves problems inherent in the prior art of semiconductor devices by increasing realized substrate area on a die by employing multiplexers or selection circuits to allow at least four banks of fuses to share one compare circuit. Additionally, to further realize increased area savings on the substrate, the memory array is divided into planes separated by shared sense amplifiers so that a number n of lines can be routed from the compare circuits to at least 2×n number of redundant rows/columns, but where only n number of rows/columns are active at any one time due to appropriate selection by isolation gates in the semiconductor device. Other features and advantages of the present invention will become apparent from studying the following detailed description of the presently preferred embodiment, together with the following drawings.

DETAILED DESCRIPTION OF THE INVENTION

Figure 1:
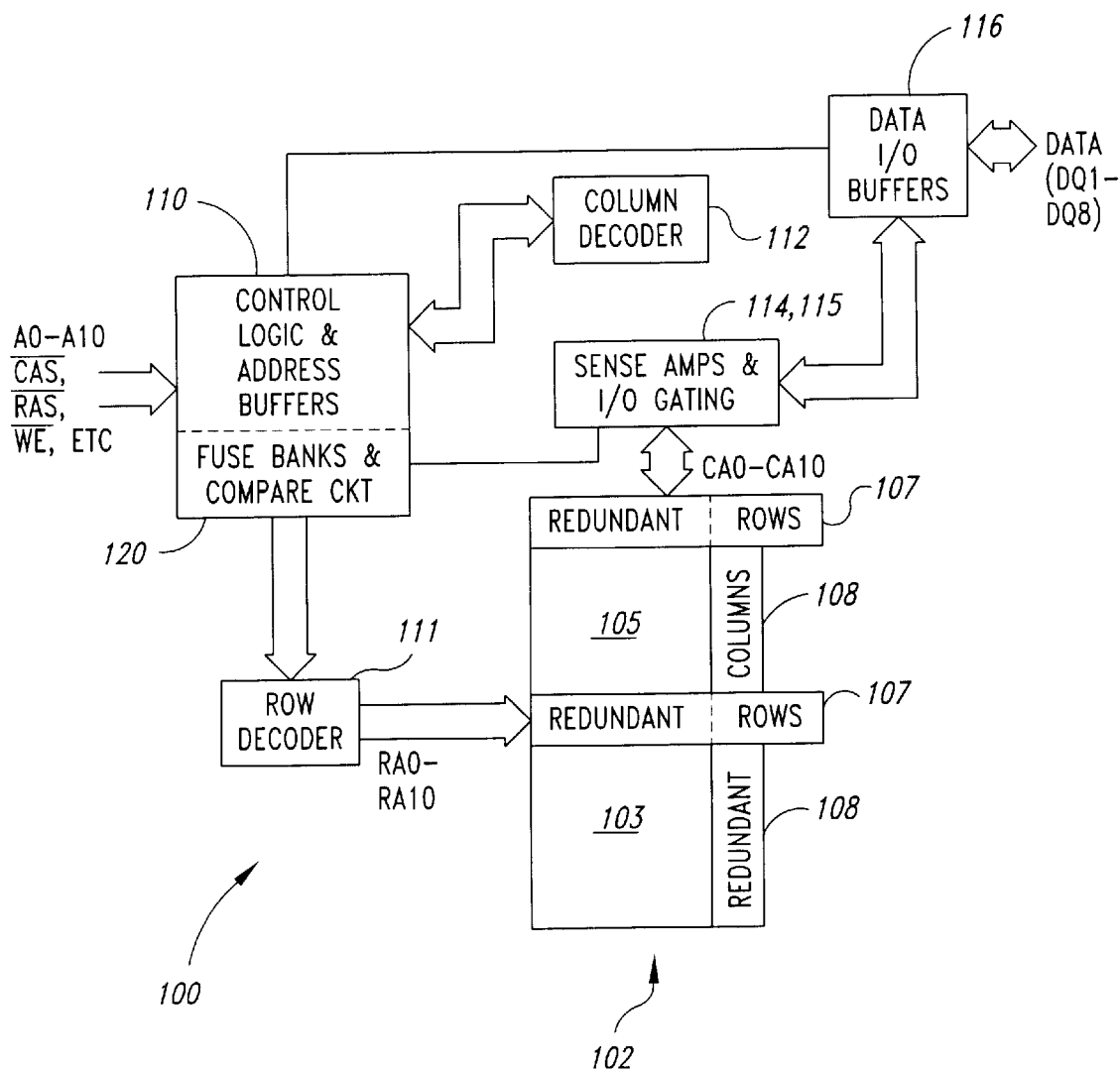
FIG. 1 is a block diagram of a semiconductor memory device under the present invention.

Referring to FIG. 1, a memory device 100 includes one or more memory arrays 102 each having primary memory sub-arrays such as two sub-arrays 103 and 105. Each of the primary memory sub-arrays 103 and 105 has redundant rows 107 and redundant columns 108 of memory cells. As described above, the redundant rows and columns 107 and 108 are selectively enabled to replace defective rows or columns of memory cells, respectively, in the primary memory sub-arrays 103 and 105.

Control logic and address buffer circuitry 10 receives externally applied signals such as an 11-bit addresses word on address lines or pins A0–A10. The control logic and address buffer circuitry 110 also receives externally generated control signals such as column address strobe CAS, row address strobe RAS, write enable WE, and so forth, as is known by those skilled in the relevant art. When the control logic and address buffer circuitry 110 receives the addresses on address lines A0–A10, it buffers and latches the addresses, and outputs them to one or more row decoders 111 and column decoders 112. If, for example, the memory array 102 is a 2 megabit by 8 array, then the row decoders 111 typically decode the higher order bits of the external address A0–A10 into an 11 bit row address RA0–RA10, while the column decoders 112 decode the lower order bits into an 11 bit column address CA0–CA10. The row decoders 111 apply the decoded address to the memory array 102 to enable a selected row in the array, while the column decoders 112, through sense amplifiers 114 and input/output gating circuits 115, employ the decoded column address to enable one or more columns in the memory array. The sense amplifiers 114 sense a value on the one or more columns and outputs the data to data input/output buffers 116, which in turn provide the data to data lines.

While the sense amplifiers 114 and input/output gating circuits 115 are shown as separate from the memory array 102, the sense amplifiers 114 and input/output gating circuits 115 are typically formed between blocks of memory within the memory array 102, as described more fully below. Sense amplifiers typically occupy relatively large area on the die, and therefore sense amplifiers are typically shared between at least two columns. For example, as explained below, each of the sub-arrays 103 and 105 of the memory array 102 is divided into multiple blocks of memory cells, where pairs of blocks are connected to the same group of sense amplifiers 114.

To isolate one column in one block of memory from the sense amplifier 114 when reading from the other column in the other block of memory, an isolation gate, typically a transistor, within the input/output gating circuit 115 is employed between the two columns. Thus, to isolate one column in one memory block from another column, the corresponding isolation transistor is turned off to disconnect the first column from the shared sense amplifier. Similarly, for the other column to be accessed, the corresponding isolation transistor is turned on, while the other isolation transistor coupled to the first column is turned off. In operation, two blocks of memory, sharing common sense amplifiers, are never simultaneously energized. Therefore, the sense amplifiers for one block isolate, and therefore de-energize, one block of memory cells from the other.

The memory device 100 also includes compare circuitry and fuse banks 120 shown as part of the control logic and address buffer circuitry 110, and as described more fully below. The control logic and address buffer circuitry 110, in response to the CAS, RAS, WE, and other control signals, operates the row decoders 111, column decoders 112, sense amps 114, I/O gating circuits 115, and data I/O buffers 116 to write data to, or read data from, the array 102. Additional description regarding writing data to, or reading data from, the memory device 100 is unnecessary, as such details are known to those skilled in the art.

Figure 2A:
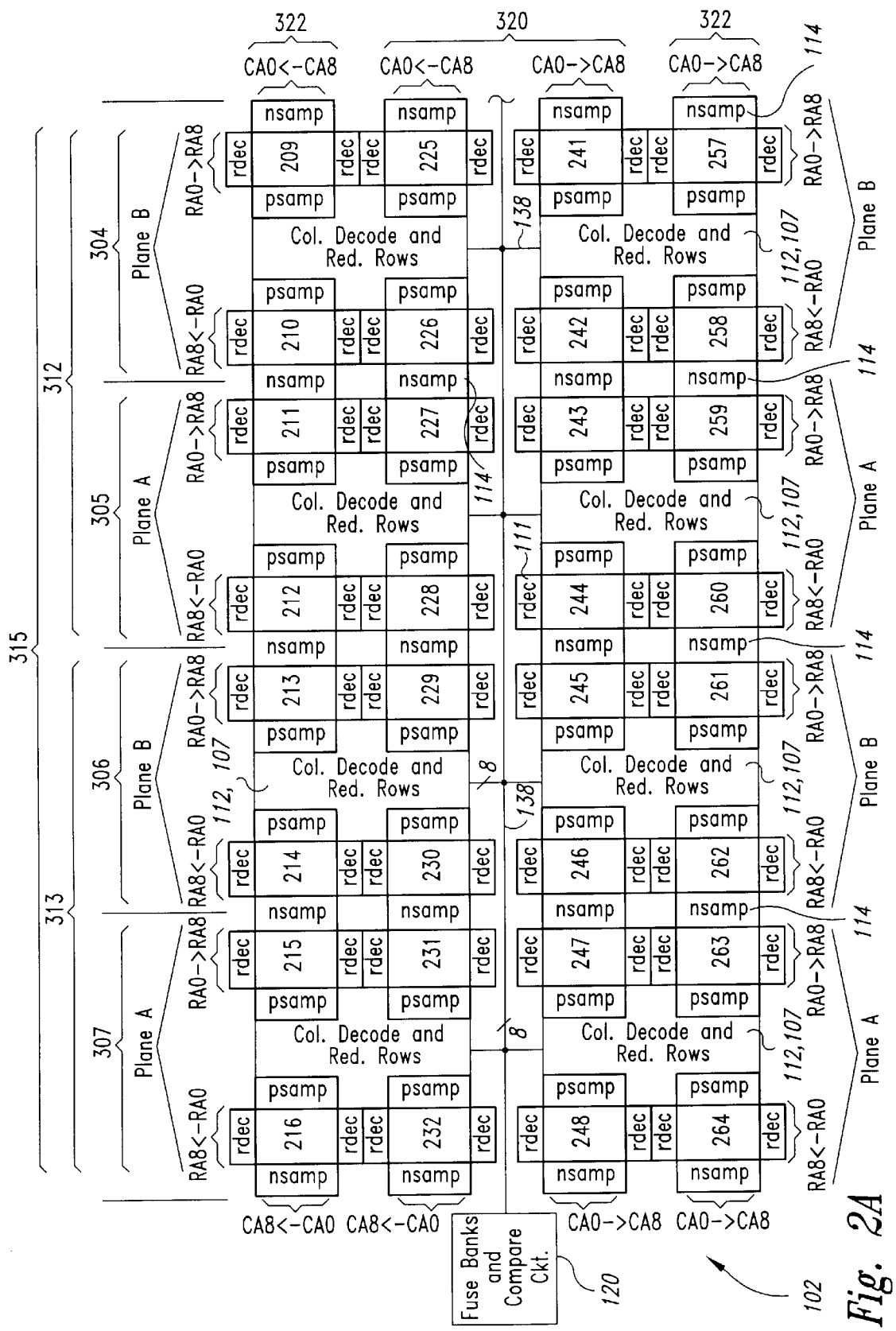
FIGS. 2A–2B are block diagrams of the memory array, fuse banks and compare circuitry of the semiconductor memory device of FIG. 1.
Figure 2B:
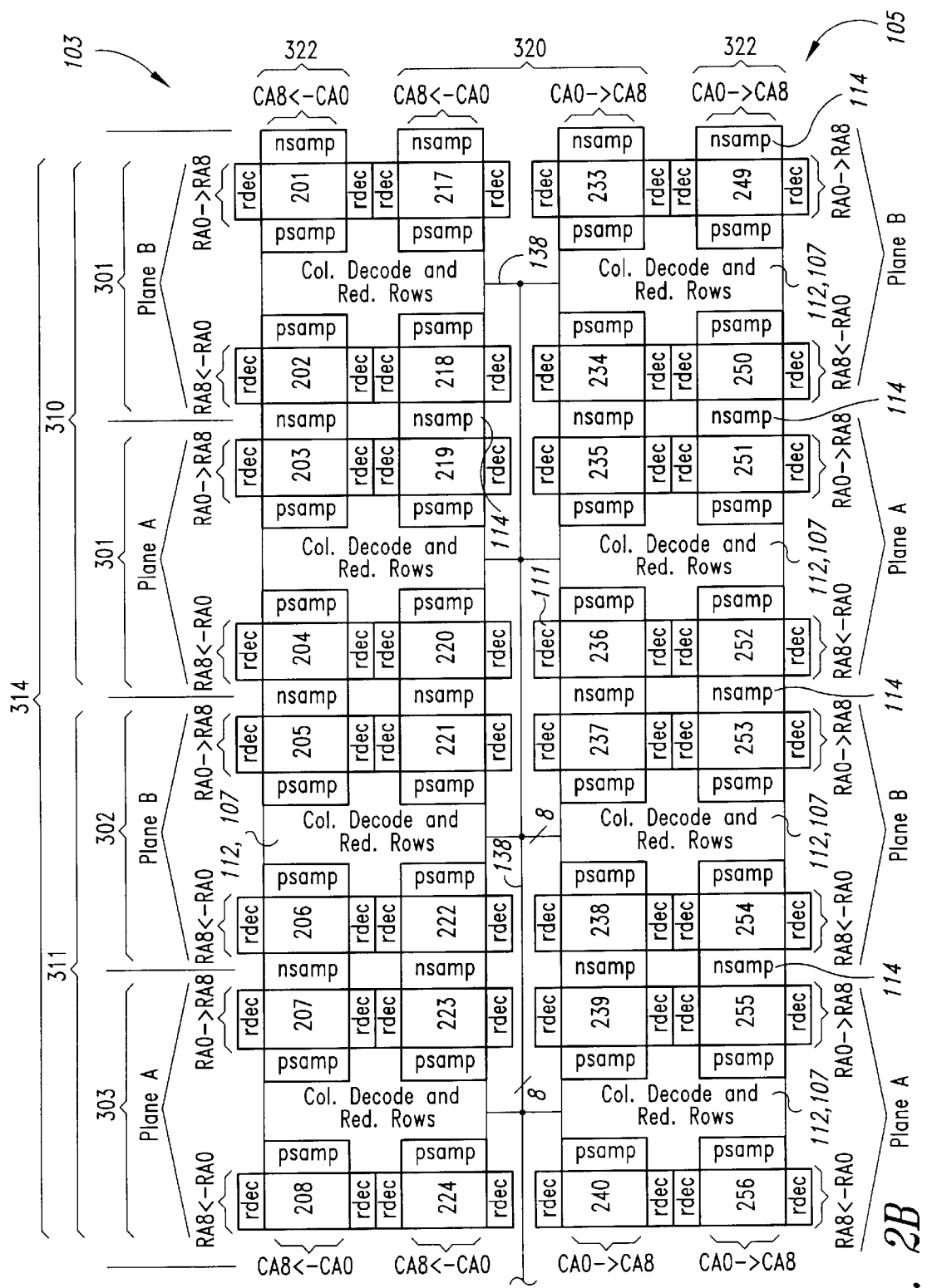

Referring to FIG. 2, an exemplary layout for the memory array 102 is shown as dividing the sub-arrays 103 and 105 into eight one-megabit sections 300–307. A first higher order subgroup 310 includes sections 300 and 301, while a first lower order subgroup 311 includes sections 302 and 303. A second higher order subgroup 312 includes sections 304 and 305, while a second lower order subgroup 313 includes sections 306 and 307. A group of higher order sections 314 includes subgroups 310 and 311, while a group of lower order sections includes subgroups 312 and 313.

Each of the sections 300–307 is divided into 256K blocks of memory cells 201–264, for a total of 64 such blocks. The column decoders 112, and redundant rows of memory cells 107, are positioned between blocks of memory cells within each section 300–307. Each block of memory cells 201–264 includes portions of one or more columns of redundant memory cells 108, as explained below. The fuse banks and compare circuitry 120 are shown at one end of the sub-arrays 103 and 105, and are coupled to each of the blocks of memory cells by means of eight lines 138 running between the sub-arrays.

In the 11-bit decoded row address, the nine least significant bits RA0–RA8 identify a row within the blocks of memory cells 201–264. The most significant bit in the column address, CA10, selects between the group of lower order sections 314 (including sections 300, 301, 302 and 303) and the group of higher order of sections 315 (including sections 304, 305, 306 and 307). Within each group of the lower and higher order sections 314 and 315, the most significant bit in the row address bit, RA10, selects between the first and second lower and higher order subgroups 310 or 311 (which include sections 300 and 301, and 302 and 303, respectively), and subgroups 312 or 313 (which include sections 304 and 305, and 306 and 307, respectively). The second most significant row address bit, RA9, then selects one of two sections within the selected lower or higher order subgroup 310, 311, 312 or 313.

Since the exemplary memory array 102 is 2-megabit by 8 memory array, an eight bit word is output for each externally applied address A0–A10, and thus two rows are simultaneously activated based on the word. For example, if a logical high value corresponds to a higher order address, then to select a row within the blocks of memory cells 215, 231, 247, 263, and a row in the blocks 216, 232, 248 and 264, the most significant column address bit, CA10, must first have a high value to select the group of higher order sections 315. The most significant row address bit, A10, must have a high value to select the higher order subgroup 313, while the second most significant row address bit, A9, must have a high value to select section 307. The remaining row address bits, RA0–RA8, then select the particular rows within the blocks of memory cells 215, 231, 247 and 263, and 216, 232, 248 and 264.

Similarly, to select four columns within the blocks of memory cells in section 307, the second most significant column address bit, CA9, selects between a group of lower order columns 320 and a group of higher order columns 322. Both of the lower and higher order groups of columns 320 and 322 span the two subarrays 301 and 305, as shown in FIG. 2. In the exemplary memory array 102, both the lower and higher order column groups 320 and 322 are simultaneously powered up, and each group activates two columns for a given externally applied address. In other words, for each external address applied to the memory array 102, four bits are output by the lower order column section 320, while four bits are also output from the higher order column section 322. Therefore, in the above example, one bit is output from each of the blocks of memory cells 215, 216, 231, 232, 247, 248, 263 and 264 based on the external address.

The memory array 102, as shown in FIG. 2, has row decoders 111 associated with each block of memory cells because the memory array is preferably fabricated with only a single layer of metal interconnect lines. Each of the multiple row decoders 111 receives external addresses applied to an address bus (not shown) in the device 100. If the memory array 102 included two or more layers of metalizing interconnect layers, then a single, centrally located, row decoder could be employed.

The exemplary memory array 102, being a 2-megabit by 8 memory array, includes 16 columns of redundant memory cells 108, and 16 rows of redundant memory cells 107. Importantly, the blocks of memory cells within the memory cell array 102 are divided into two sets or planes, plane A and plane B, based on the sections 300–307, where each plane has one-half of the total number of memory cells (i.e., each having 8 megabits). The rows and columns of redundant memory cells 107 and 108 are similarly divided with eight redundant rows and columns for each plane A and B. Eight redundant rows/columns 107 and 108 can replace any defective row or column in the plane A of primary memory, while eight redundant rows/columns can replace any defective row/column in plane B of the primary memory. It has been statistically found that eight redundant rows and columns for each 8-megabit plane is sufficient to replace the number of malfunctioning memory elements typically found during testing.

Rather than dividing the planes A and B based on the sub-arrays 103 and 105, the planes A and B span the two sub-arrays, as shown in FIG. 2. As explained more fully below, such a division of the memory array 102 allows for a reduced number of lines intercoupling the row and column decoders 111 and 112 with the fuse banks and compare circuitry 120. The second most significant bit in the eleven bit row address (i.e., RA9) selects between the planes A and B. Therefore, for example, if the row address bit RA9 has a high value, then sections 301, 303, 305 and 307 are enabled for plane A, while if the bit RA9 has a low value, then sections 300, 302, 304 and 306 are enabled for plane B. The row and column decoders 111 and 112 receive this address bit (as well as the other address bits in the address word) to enable only at most half of the memory cells in the memory array 102 (i.e., either plane A or plane B). In other words, the planes A and B are logically separated by the row address, namely the second most significant bit in the address.

While being spatially divided between various blocks, groups and sub-arrays of memory cells within the memory array 102, each of the redundant rows and columns are logically contiguous. For example, each of the eight redundant columns from plane A physically extends through the blocks of memory cells 219, 220, 223, 224, 227, 228, 231, 232, 235, 236, 239, 240, 243, 244, 247 and 248, or through the blocks of memory cells 203, 204, 207, 208, 211, 212, 215, 216, 251, 252, 255, 256, 259, 260, 263 and 264, all of which are in plane A. The rows and columns of redundant cells 107 and 108 in plane A do not extend through the blocks of memory cells within the plane B. Likewise, a logically contiguous row or column of redundant cells 107 or 108 in plane B physically extends through all blocks of memory cells in plane B, but none of the memory cells in plane A.

Figure 3:
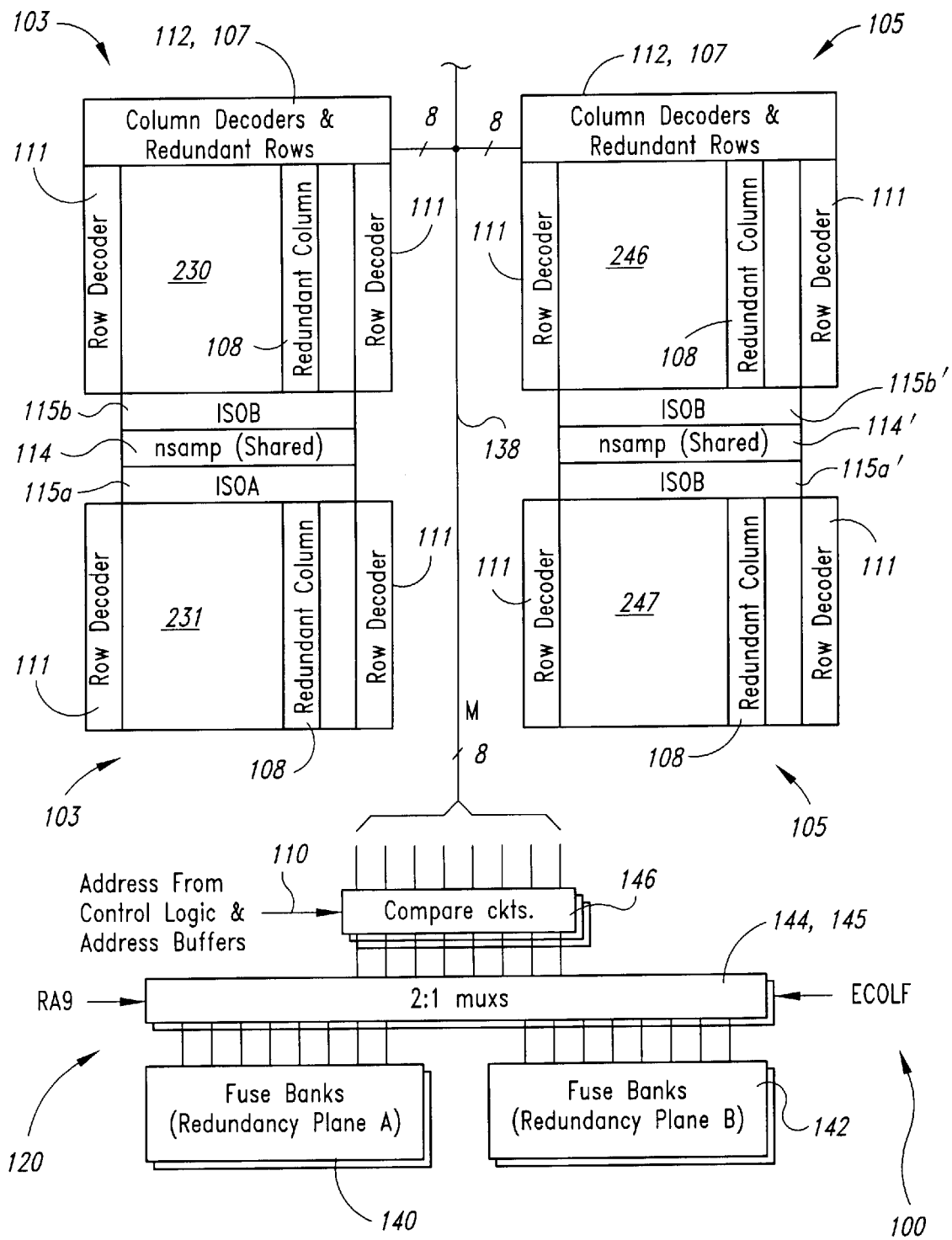
FIG. 3 is an enlarged block diagram of FIG. 2 showing four blocks of memory cells, compare circuits, multiplexers, fuse banks, and other associated circuitry for the semiconductor memory device of FIG. 1.

As shown more clearly in FIG. 3, the planes A and B are divided based on shared sense amplifiers 114 located between two blocks of memory cells. For example, in the sub-array 103, the block 231 of memory cells forms part of plane A, while block 230 forms part of plane B. The blocks 231 and 230 are separated by shared sense amplifiers 114 (n channel sense amps) formed therebetween. Isolation gates 115A isolate the block of memory cells 231 from the shared sense amplifiers 114, while isolation gates 115B isolate the block of memory cells 230 from the sense amplifiers. Similarly, in the sub-array 105, the block 247 of memory cells forms part of the redundancy plane A, while the block 246 forms part of the redundancy plane B. The blocks 247' and 246' are separated by shared sense amplifiers 114' formed therebetween. Isolation amplifiers 115A' isolate the block of memory cells 247 from the shared sense amplifiers 114', while isolation gates 115B' isolate the block of memory cells 246 from the sense amplifiers.

Two sets of fuse banks 140 and 142 include several groups of fuses that can be selectively configured to permanently store addresses of defective memory cells within a row or column in the array of primary memory cells. The first set of fuse banks 140 provides addresses for defective memory cells within the plane A of memory cells, while the second set of fuse banks 142 provides addresses for defective memory cells within the plane B of memory cells. As explained more fully below, several two-to-one multiplexers 144 and 145 selectively couple the first or second sets of fuse banks 140 and 142 to several compare circuits 146. The compare circuits 146 receive external addresses from the control logic and address buffer circuitry 110 and compare these addresses to addresses stored in one of the two sets of fuse banks 140 and 142.

In operation, if one or more rows of the primary memory cells contain defective cells therein, then the addresses for the defective cells are stored in the fuse banks 140 and 142 during initial testing of the device 100. The compare circuits 146 each receive an address from the control logic and address buffer circuitry 110 and compare it to one or more addresses stored in one of the first and second sets of fuse banks 140 and 142. The multiplexers 144 and 145 receive the second most significant row address bit (e.g., RA9), which selects between the first and second sets of fuse banks 140 and 142, as explained more fully below. If the address received from the control logic and address buffer circuitry 110 matches one of the addresses stored in the fuse banks 140 or 142, then the compare circuit 146 outputs a match signal M on one of the lines 138 to each of the row and column decoders 111 and 112.

If the device 100 is currently in its row access mode (e.g., after RAS falls), then the column decoders 112 ignore the signals on the lines 138, and only the row decoders 111 receive and decode the match signal M. If one of the eight lines 138 has a high value, then the row decoders 111 in response thereto enable the appropriate row of redundant memory cells in the redundant rows 107. For example, if one of the compare circuits 146 determines a match based on an incoming address, then it outputs a match signal M on one of the lines 138 (e.g., on the first of eight lines). In response to this signal, each of the row decoders 111 enables one of the eight rows in the eight redundant rows 107 in the plane A (e.g., the first of eight redundant rows).

Only eight lines 138 are employed to couple the compare circuits 146 with all of the redundant rows and columns 107 and 108 in the memory array 102. By dividing the planes along boundaries defined by the shared sense amplifiers 114, no two redundant columns on either side of the shared sense amplifier will be simultaneously activated. In other words, no redundant columns 108 from plane B will be activated when redundant columns 108 from plane A are energized. Therefore, eight lines 138 can be coupled to eight redundant columns 108 running through the memory array 102, where the redundant columns can be conceptualized as having twice the length of standard columns in the array. The sense amplifiers 114 selectively enable only half of the eight redundant columns at any one time. As a result, the eight redundant columns 107 are partitioned into two sets of eight columns each having standard length, thereby providing eight redundant columns for plane A and eight redundant columns for plane B. Otherwise, as is currently performed in the art, at least 16 lines must be routed from the compare circuits 146 to 16 separate redundant rows and columns.

Figure 4:
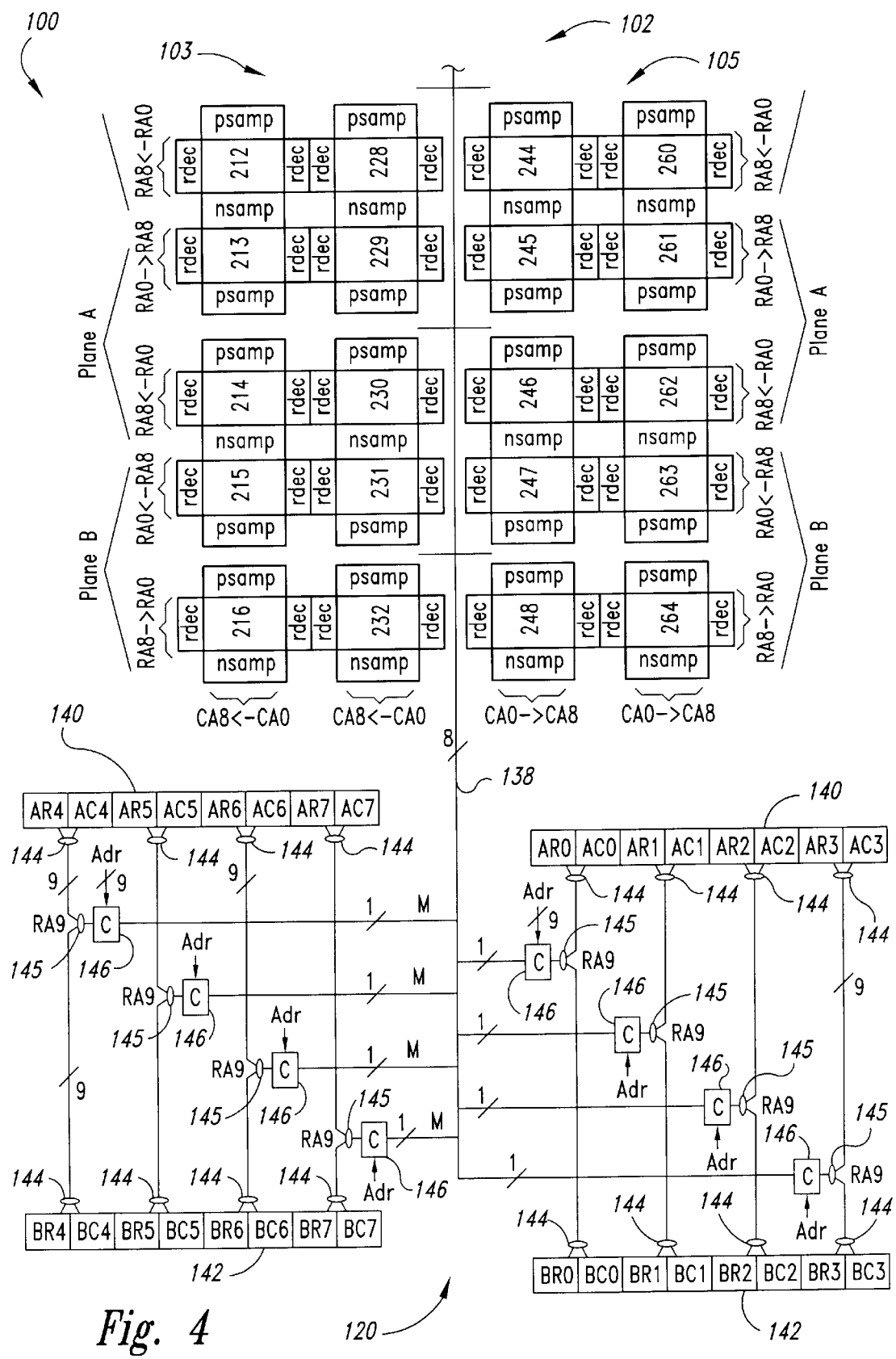
FIG. 4 is a block diagram of several blocks of memory, and fuse banks, multiplexers and compare circuits for the semiconductor memory device of FIG. 1.

Referring to FIG. 4, the fuse banks 140, 142, multiplexers 144, 145 and compare circuits 146 are shown in greater detail. The first set of fuse banks 140 includes a first set of higher order fuse banks AR4, AC4, AR5, AC5, AR6, AC6, AR7, and AC7, and a second set of lower order fuse banks AR0, AC0, AR1, AC1, AR2, AC2, AR3, and AC3, all for the plane A. Fuse banks AR0–AR7 correspond to the eight redundant rows of memory cells in the plane A, while the fuse banks AC0–AC7 correspond to the eight redundant columns of memory cells in plane A.

Similarly, the second set of fuse banks 142 includes a first set of higher order fuse banks BR4, BC4, BR5, BC5, BR6, BC6, BR7, BC7, and a second set of lower order fuse banks BR0, BC0, BR1, BC1, BR2, BC2, BR3, and BC3. Fuse banks BR0–BR7 correspond to the eight redundant rows of memory elements in plane B while fuse banks BC0–BC7 correspond to the eight redundant columns of memory cells in plane B. Overall, there is a one-to-one correspondence between each fuse bank and each redundant row or column so that each fuse bank is capable of causing only one row or column of redundant memory cells to be enabled, as described more fully below.

As shown in FIG. 4, each pair of fuse banks of a given order for redundant rows or columns, in a given redundancy plane, is coupled to a first set of 2:1 multiplexers 144. For example, the fifth order row and column fuse banks AR4 and AC4 in the first set of fuse banks 140, are both coupled to the multiplexers 144. As is known in the art, an external address applied to the memory device 100 is broken up and decoded into separate row and column addresses. As a result, the external address typically first enables a given row within the memory array 102, and thereafter, enables a specified column. The row and column addresses are never initially activated simultaneously to the memory array 102 (however, once the selected row is addressed, it is held active until a given column is addressed). Therefore, as noted above, the row address can be compared to the row address stored in fuse bank AR4 at a first time (e.g., after RAS falls), while thereafter, the column address can be compared to the address stored in the fuse bank AC4 at a second time (e.g., after CAS falls). At no time will both of the row and column addresses be compared simultaneously. Therefore, the multiplexers 144 can selectively couple one of the two fuse banks AR4 and AC4 to the output of the multiplexer depending upon whether an external row or column address is to be compared to a fuse row address or a fuse column address.

Likewise, only one of the two planes A or B of the memory array 102 will be energized based on a given address. Specifically, the second most significant bit in the 11-bit row address (bit RA9) is applied to a second set of 2:1 multiplexers 145 that select between the planes A and B. As noted above, if the second most significant address bit RA9 has a binary value of 0, then plane A is selected, while a binary value of 1 selects plane B. As a result, if plane A is selected, the compare circuits 146 need not compare an external address to fuse addresses in the second set of fuse banks 144 (i.e., addresses stored in fuse banks BR0–BR7 or BC0–BC7). Therefore, not only is one compare circuit 146 employed for each row and column fuse bank of a particular order, but also row and column fuse banks of a particular order for both planes A and B are shared with the one compare circuit.

For example, fuse banks AR4 and AC4 are coupled to a multiplexer from the first set of multiplexers 144, fuse banks BR4 and BC4 are coupled to another multiplexer from the first set of multiplexers 144, and the two multiplexers 144 in turn are coupled to a multiplexer from a second set of multiplexers 145 whose output is coupled to a single compare circuit 146. At a specific time during each read or write cycle for the memory device 100, the compare circuit 146 compares the external address to one of the four fuse addresses stored in fuse banks AR4, AC4, BR4, BC4. Likewise, fuse banks AR5, AC5 are coupled to a multiplexer 144, fuse banks BR5 and BC5 are coupled to a multiplexer 144, and these two multiplexers are in turn coupled to a multiplexer 145 whose output is coupled to another compare circuit 146. At a specific time during each read or write cycle, the compare circuit 146 compares the external address to one of the fuse addresses stored in fuse banks AR5, AC5, BR5 and BC5. The remaining fuse banks in the first and second set of fuse banks 140 and 142 are likewise coupled to two multiplexers 144, one multiplier 145 and one compare circuit 146, as shown in FIG. 4. As noted above, the compare circuits 146 receive external addresses from the address bus (shown as the signal input Adr in FIG. 4). The output of each of the compare circuits 146 is a single line, which carries the match signal M to the row and column decoders 111 and 112. As explained more fully below, the match signal M has a logical 1 output when the external address matches a particular fuse address.

Figure 5:
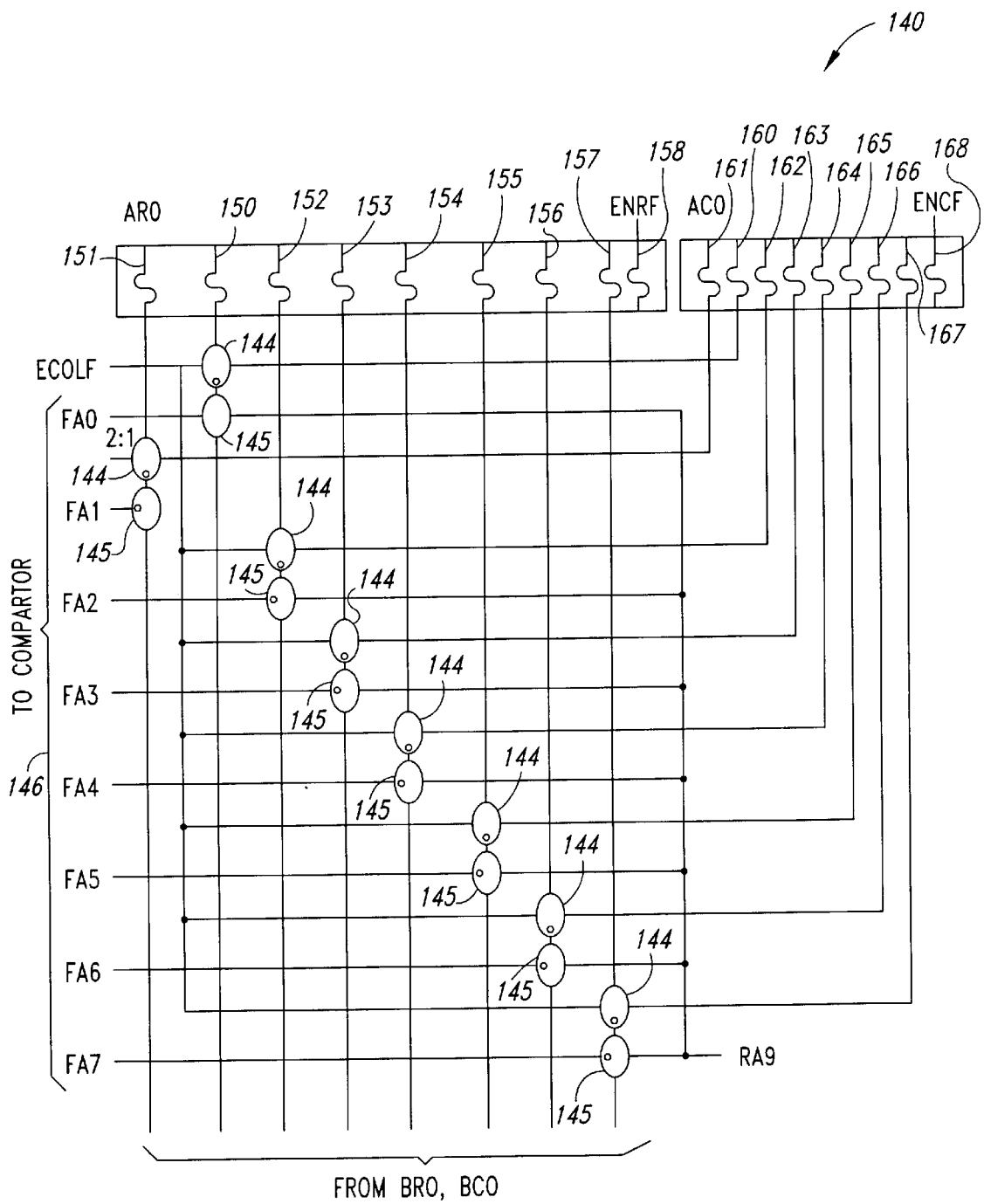
FIG. 5 is a block diagram of the fuse banks and compare circuits of a portion of FIG. 4.

As shown in more detail in FIG. 5, two fuse banks AR0 and AC0 for the first set of fuse banks 140 are shown together with their associated multiplexers 144 and 145. The fuse bank AR0 contains nine fuses 150–158, the first eight of which define a preselected address that is blown or established during factory testing for the device 100. Each of the first eight fuses 150–157 corresponds to one bit in an eight-bit address, where fuse 150 corresponds to the least significant bit, while fuse 157 corresponds to the most significant bit. The ninth fuse is an enable fuse that indicates whether the fuse bank has indeed been blown during factory testing. The ninth fuse distinguishes a "blown" fuse address of 11111111, from an unblown fuse address which will output the same value. In other words, if the ninth fuse is blown, so as to produce an enable row fuse signal ENRF, then the remaining eight fuses specify an address of a defective row within the plane A of memory cells in the memory array 102. Similarly, the fuse bank AC0 contains eight fuses 160–167 that specify a fuse address for a defective column within the plane A of the memory array 102. A ninth fuse 168 enables the bank AC0 by providing an enable column fuse signal ENCF.

Each fuse 150–157 in the fuse bank AR0 is coupled with its appropriately ordered fuse 160–167 in the fuse bank AC0 by means of a 2:1 multiplexer 144. For example, the first order fuse 150 in the fuse bank AR0 is coupled to the first order fuse 160 in the fuse bank AC0 by means of a first multiplexer 144. Each of the first multiplexers 144 receives one bit of an eight-bit fuse address stored in one of the fuse banks AR0–AR7, BR0–BR7, AC0–AC7 or BC0–BC7.

The first multiplexers 144 select between their two inputs from fuse banks AR0 and AC0 based on an enable column fuse signal ECOLF input thereto. The enable column fuse signal ECOLF is a signal generated by the control logic and address buffer circuitry 110 at a predetermined time after RAS transitions to its active state (e.g., falls to a low level). ECOLF in one state (e.g., low) indicates active row address latching, and therefore, the first multiplexers 144 output signals from the row address fuse banks such as fuse bank AR0. When ECOLF transitions to its second state (e.g., rises to a high level), then column addresses are active, and therefore, the first multiplexers 144 output signals from the column fuse banks such as fuse bank AC0.

The outputs of the first multiplexers 144 are input to the second multiplexers 145. While the first multiplexers 144 each receive single bits of fuse addresses for row and column addresses in one plane, the second multiplexers 145 each receive single bits of row and column fuse addresses from both planes A and B. Therefore, the second multiplexers 145 in FIG. 5 each receive an address bit from fuse addresses stored in the fuse banks AR0 and AC0 for plane A, and BR0 and BC0 for plane B. For example, where the first multiplexer 144 receives signals from the fuses 150 and 160 for the fuse banks AR0 and AC0, the second multiplexer 145 to which the multiplexer 144 is coupled receives the first order fuses from the fuse banks BR0 and BC0.

The second multiplexers 145 are selectively switchable by the highest order bit in the external address signal which is input thereto. As noted above, the second most significant bit in the decoded 11-bit row address (i.e., address bit RA9) selects between the planes A and B, so that only one of the two address planes is active during operation of the memory array 102. Likewise, the address bit RA9 is input to the second multiplexers 145 to selectively output signals from either (i) the fuse banks from plane A if the address bit is low (e.g., AR0 and AC0), or (ii) the fuse banks from plane B if the address bit is high (e.g., BR0 and BC0).

Each of the second multiplexers 145 output one bit of a fuse address from one of the fuse banks AR0, AC0, BR0 or BC0, as fuse address FA0 through FA7. To summarize, if for example ECOLF has a low value, and RA9 has a high value, then the fuse address FA0–FA7 output from the second multiplexers 145 corresponds to the fuse address stored in fuse bank BC0. The fuse address FA0–FA7 is input to a compare circuit 146 to be compared to the external address simultaneously applied to the compare circuit.

The multiplexer circuits 144 and 145 are of conventional construction. The outputs for the multiplexer circuits 144 and 145 are shown as a small "o." While 2:1 multiplexer circuits are shown and described herein, the term "multiplexer circuit" is used generically, and the present invention can employ other switchable circuit elements for selectively coupling the fuse banks 140, 142 with the compare circuits 146, such as pass gates.

Figure 6:
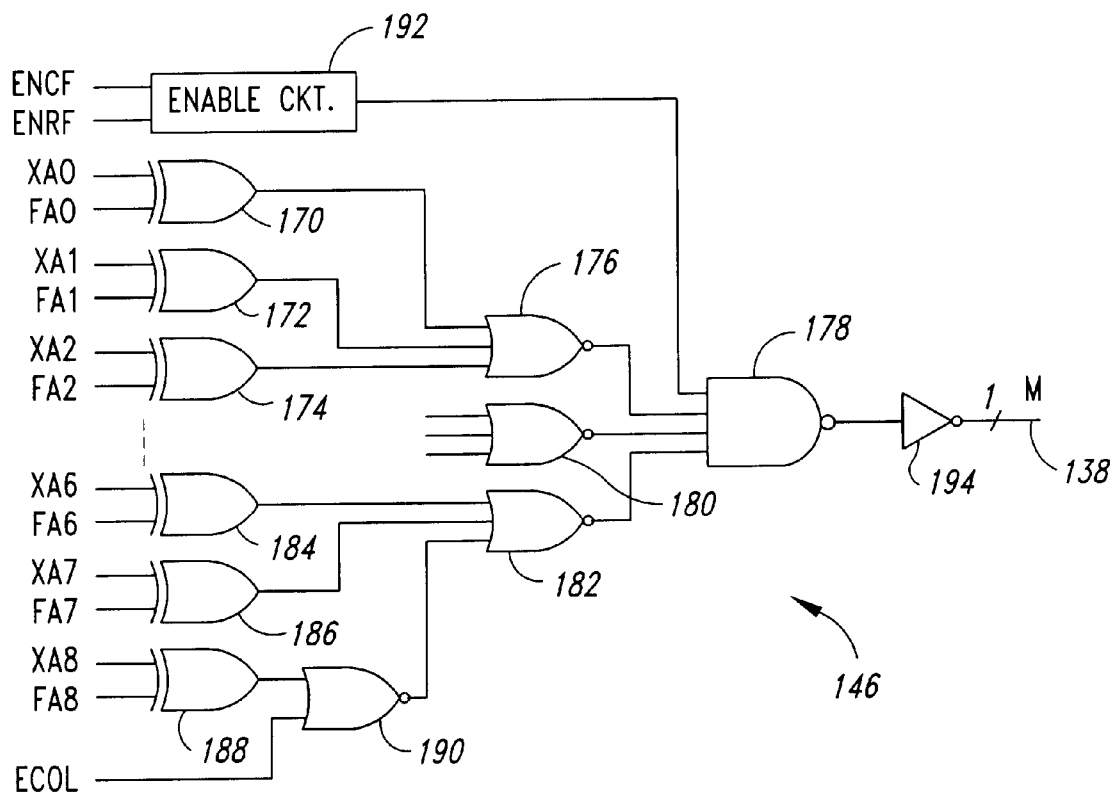
FIG. 6 is a partial schematic, partial block diagram of one of the compare circuits of FIG. 4.

Referring to FIG. 6, an exemplary circuit for the compare circuits 146 is shown. A first exclusive OR gate 170 receives at its inputs the first bit FA0 of the fuse address FA0–FA7, and the first bit XA0 of the external address XA0–XA8. If both of the address bits FA0 and XA0 match, i.e., both have a high value or both have a low value, then the exclusive OR gate 170 outputs a 0 value. Similarly, second and third exclusive OR gates 172 and 174 receive the second fuse address bit FA1 and second external address bit XA1, and third fuse address bit FA2 and third external address bit XA2, respectively.

The outputs from the three exclusive OR gates 170, 172 and 174 are input to a three-input NOR gate 176. If all three exclusive OR gates 170, 172 and 174 output a low value, then the exclusive OR gate 176 outputs a high value to a four-input NAND gate 178. A second NOR gate 180 receives at its three inputs the outputs from three exclusive OR gates (not shown) that receive fourth, fifth and sixth fuse addresses FA3, FA4 and FA5, and external addresses XA3, XA4 and XA5, respectively. Similarly, a third set of three exclusive OR gates 184, 186 and 188 receive at their inputs the seventh, eighth and ninth fuse and external address bits FA6–FA8 and XA6–XA8, respectively.

In each plane A and B of the memory array 102, external addresses corresponding to defective columns require only eight bits (XA0–XA7), while external addresses corresponding to defective rows require nine bits (XA0–XA8). Therefore, a NOR gate 190 receives at its first input the output from the exclusive OR gate 188, and at its second input the ECOLF signal. As a result, when the ECOLF signal is high, and the device 100 is in its column addressing period, then the NOR gate 190 always outputs a low value to the NOR gate 182 to allow the NOR gate 182 to output an active high value (depending upon the outputs of the exclusive OR gates 184 and 186), regardless of the output from the NOR gate 188. However, if ECOLF has a low value, then the output of the NOR gate 190 is dependent upon the output of the exclusive OR gate 188.

An enable circuit 192, of conventional construction, receives at its inputs the enable column fuse and enable row fuse signals ENCF and ENRF, which indicate whether the fuse address FA0–FA8 corresponds to an enabled fuse bank. If so enabled, then the enable circuit 192 outputs a high value to the four-input NAND gate 178. Therefore, if all of the bits of the fuse address match with all of their corresponding bits in the external address, and the appropriate fuse bank was enabled, then the four-input NAND gate 178 receives at its four inputs four high values, and outputs an active low value in response thereto. A low value output from the NAND gate 178 indicates that the external address is for a memory cell in a defective row or column, and therefore the external address correlates to a fuse address.

The low value is then inverted by an inverter 194 to become the high match signal M on the line 138. Referring back to FIG. 4, if any one of the compare circuits 146 outputs a high match signal M, then one of the match lines 138 has a high value that is routed to the row and column decoders 111 and 112, to thereby activate the appropriate row or column within the sets redundant rows or columns 107 or 108 in the memory array 102. The device 100 thereby properly substitutes the defective row/column with a redundant row/column.

In summary, the present invention reduces the area that the device 100 requires on a die by allowing rows and columns of redundant memory cells 107 and 108 to share compare circuitry 146 based on the division of the memory array 102 into the two planes A and B. The first and second sets of multiplexers 144 and 145 selectively couple groups of at least four fuse banks to one compare circuit 146. Preferably, the ECOLF signal selects between row and column fuse banks, while the second most significant bit in the row address (e.g., row address bit RA9) selects between the fuse banks in planes A and B. As a result, only one compare circuit is not only required for two fuse banks for a redundant row and a redundant column, but also for a pair of redundant row and columns for each plane.

Additionally, the present invention reduces the number of lines coupled between the compare circuits 146 and the rows and columns of redundant memory elements 107 and 108 in the memory array 102. The present invention maps the memory array 102 into preferably two planes A and B. The planes A and B span between blocks of memory in the memory array 102, where each block is divided by the shared sense amplifiers 114. As a result, while eight lines are coupled to 16 rows or columns, only eight rows or columns will be active at any one time because the isolation gates 115 will enable only eight of the 16 rows or columns within planes A and B. As a result, the present invention saves on the number of lines required to intercouple the compare circuits to the redundant rows/columns, thereby realizing increased area on the chip for additional circuitry.

An additional benefit of the present invention relates to the way in which the planes A and B are selected. As is known, to access the rows and columns of memory cells in the memory array 102, all eleven address pins, A0 through A10 on the packaged chip are required. However, during a compression test mode for the device 100, address values are compressed or multiplexed to allow similar data to be written to multiple address locations in the memory arrays 102. By compressing address values and accessing, e.g., the two sub-arrays 103 and 105 simultaneously, fewer addresses are required. Since the planes A and B are separated by the shared sense amplifiers 114, at no time during compression mode testing will primary or redundant memory cells on both sides of the shared sense amplifier 114 (FIG. 3) be tested. As a result, such a division of the memory array 102 into the two planes A and B will not provide any access conflicts, or otherwise interfere with even the most compressed testing of the device 100.

Figure 7:
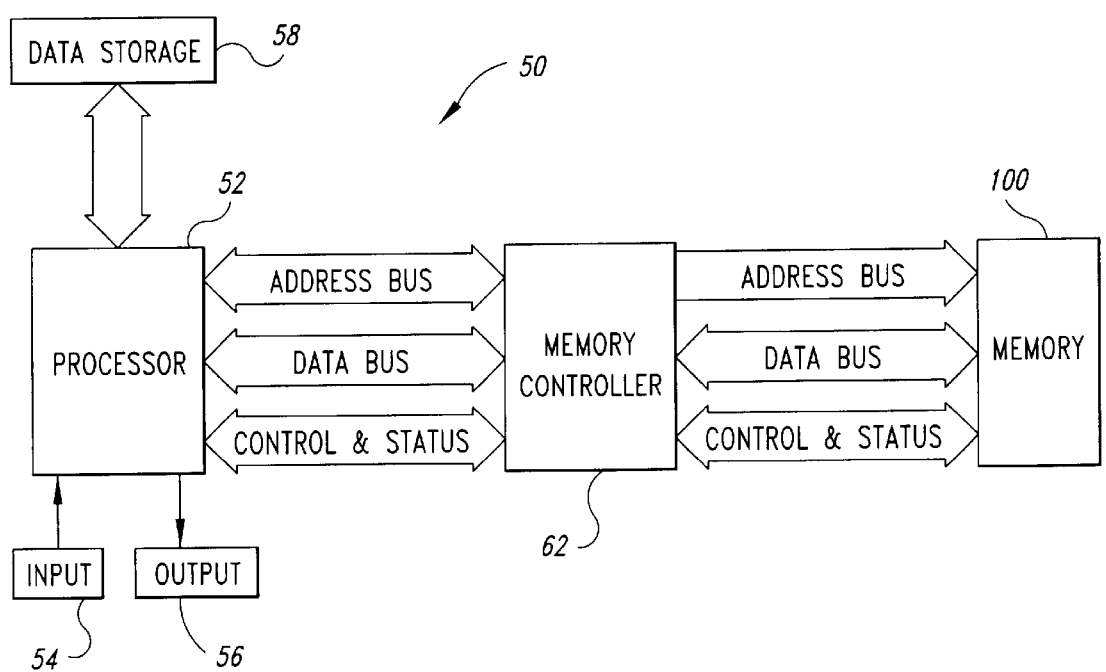
FIG. 7 is a block diagram of a computer system that incorporates the memory device of FIG. 1.

Since the device 100 provides a beneficial architecture for realizing improved die area, which can allow for enhanced or improved performance of the device, systems employing the device can benefit from the present invention. Referring to FIG. 7, a block diagram of a computer system 50 that uses one or more memory devices 100 is shown. The computer system 50 includes a processor 52 for performing computer functions, such as executing software to perform desired calculations and tasks. The processor 52 is connected to the one or more memory devices 100 through a memory controller 62 that provides the appropriate signals to the memory. One or more input devices 54, such as a keypad or a mouse, are coupled to the processor 50 and allow an operator (not shown) to input data thereto. One or more output devices 56 are coupled to the processor 52 to provide the operator with data generated by the processor 52. Examples of output devices 56 include a printer and a video display unit. One or more data storage devices 58 are coupled to the processor 52 to store data on or retrieve data from external storage media (not shown). Examples of storage devices 58 and corresponding storage media include drives for hard and floppy disks, tape cassettes, and compact disc read-only memories (CD-ROMs). Typically, the processor 50 generates the address signals A0–RA9, control signals such as CAS, RAS, WE, etc., and the data that is written to the memory device 100, as shown by the address, data, control, and status buses, shown in FIG. 7.

The present invention is generally described above as employing inverters, NAND and NOR gates because the device 100 is preferably manufactured using conventional NMOS semiconductor manufacturing techniques. Other logic elements or manufacturing techniques can be substituted to perform the goals of the present invention, as is known by those skilled in the relevant art.

While the detailed description has been expressed, in part, in terms of specific examples, those skilled in the art will appreciate that many other variations could be used to accomplish the purpose of the disclosed invention. For example, those skilled in the art will recognize that while the device 100 is generally described above as being a DRAM memory device, the present invention is applicable to all memory devices, including high-speed memory devices such as synchronous DRAM or video or graphics memory (SVRAM and SGRAM), and extended data out, burst extended data out memory devices (EDO and BEDO).

Those skilled in the art will recognize that the present invention is also applicable to various types of semiconductor circuitry employing comparison circuitry and redundant circuit elements, and is not necessarily limited for use in semiconductor memory devices. Additionally, while the device 100 employs eight match lines coupled to all of the redundant elements, the device can include nine match lines, with the ninth line being a global access track or phase line (not shown) for tracking the timing of data access to and from the redundant elements. Furthermore, while multiple row decoders 111, column decoders 112, compare circuits 146, and multiplexers 144, 145 are shown and described, the present invention can provide a reduced number of such elements if, for example, a second metalizing layer were employed.

Moreover, while two planes A and B are generally described above, the present invention is equally applicable for use in semiconductor devices employing a greater number of redundancy planes, and thereby employ appropriate multiplexers such as 4:1 multiplexers. Additionally, while the present invention shows the fuse banks 140 and 142 consolidated and positioned at one end of the device 100, the fuses can be non-laser blown fuses positioned with the redundant rows and columns 107 and 108, throughout the device. While the planes A and B are divided along shared sense amplifier boundaries, the planes can be divided along other boundaries as long as no addressing conflicts occur such as columns from two different planes being simultaneously activated. Accordingly, it can be appreciated that equivalent modifications to the above-described embodiments can be made without departing from the spirit and scope of the invention. Therefore, the present invention is limited only by the following claims.

What is claimed is:

1. A computer system coupled to first and second voltage supply terminals, comprising:
    a data input device;
    a data output device;
    an address bus; and
    computing circuitry coupled to the data input and output devices and the address bus, the computing circuitry including a memory device having a plurality of rows and columns of memory cells divided into at least first and second complementary planes which are not simultaneously active, and having at least one electronically programmable resistance circuit that stores at least two bits of information, the programmable resistance circuit comprising:
        first and second programmable resistance cells each coupled at first terminals to the first voltage supply terminal;
        a shared selection circuit coupled to the first and second programmable cells and having an output terminal;
        an output circuit coupled to the second voltage supply terminal and the output terminal of the selection circuit and having a data output terminal.

2. The computer system of claim 1 wherein the selection circuit comprises a multiplexing circuit.

3. An integrated circuit device couple to first and second voltage supply terminals, comprising:
    a plurality of rows and columns of circuit cells divided into at least first and second planes that are not simultaneously active; and
    a plurality of electronically programmable resistance circuits, each programmable resistance circuit storing at least two bits of information of at least one address of at least one circuit cell in at least one of the plurality of rows and columns of circuit cells, each programmable resistance circuit comprising:
        first and second programmable resistance cells each coupled to the first voltage supply terminal, the first and second programmable resistance cells storing first and second bits of information, respectively; and
        a single selection circuit coupled to the first and second programmable resistance cells and adapted to receive a selection signal indicating which of the first and second planes is active, the selection circuit operable in response to the selection signal to output the bit of information from the corresponding resistance cell in the active plane.

4. The integrated circuit of claim 3 wherein the first and second programmable resistance cells comprise antifuses, wherein the first antifuse cell stores a logic state corresponding to one bit of an address of a defective memory cell in one of the plurality of rows of memory cells, and the second antifuse cell stores a logic state corresponding to one bit of an address of a defective memory cell in one of the plurality of columns of memory cells.

5. The integrated circuit of claim 3 wherein the selection circuit comprises a multiplexing circuit.

6. A data storage and output circuit for a semiconductor memory device having a plurality of memory cells divided into first and second planes, the circuit being coupled to first and second voltage terminals and storing at least two bits of information, the circuit comprising:
    first and second electronically programmable resistance cells each coupled at first terminals to the first voltage terminal;
    a shared selection circuit coupled to the first and second programmable resistance cells and having an output terminal, the shared selection circuit providing either a first or a second bit of information from the first or second programmable resistance cells on the output terminal in response to a selection signal indicating which of the first and second planes is active; and
    an output circuit having a data output terminal and being coupled to the second voltage supply terminal and being coupled to the output terminal of the shared selection circuit to receive the provided first or second bit of information, the output circuit providing the received first or second bit of information on the data output terminal.

7. The circuit of claim 6 wherein the selection circuit comprises a multiplexing circuit.

8. A semiconductor memory device coupled to first and second voltage supply terminals, comprising:
    a plurality of rows and columns of primary and redundant memory cells, wherein the plurality of primary and redundant memory cells are divided into first and second complementary blocks;
    a plurality of electronically programmable resistance circuits, each storing at least one bit of information of an address of one of the plurality of rows of primary memory cells and at least one bit of information of an address of one of the plurality of columns of primary memory cells, each programmable circuit comprising:
        first and second programmable resistance cells, each coupled to the first voltage supply terminal;
        a single shared selection circuit coupled to both of the first and second programmable cells and having an output terminal, the single shared selection circuit selectively providing first and second bits of information from the first and second programmable cells to the output terminal in response to a selection signal indicating which of the first and second blocks of memory cells is active; and
        a single output circuit coupled to the second voltage supply terminal and the output terminal of the single shared selection circuit and having a data output terminal, the output circuit providing the first and second bits of information of the first and second programmable cells on the data output terminal.

9. The semiconductor memory device of claim 8 wherein the first and second programmable cells comprise antifuses, wherein the first antifuse stores a logic state corresponding to one bit of an address of a defective memory cell in one of the plurality of rows of memory cells, and the second antifuse stores a logic state corresponding to one bit of an address of a defective memory cell in one of the plurality of columns of memory cells.

10. The semiconductor memory device of claim 8 wherein the selection circuit comprises a multiplexing circuit.

11. A method of reading data stored in first and second electronically programmable resistance cells in a semiconductor device having at least two planes of circuit cells that are not simultaneously active, the method comprising:
   providing a shared selection circuit coupled to both the first and second programmable cells;
   receiving a selection signal at the shared selection circuit, wherein the selection signal corresponds to which of the at least two planes of circuit cells are active; and
   selectively outputting either first or second bits of information from the first or second programmable cells based on receipt of either the first or second selection signals, all respectively.

12. The method of claim 11 wherein the step of selectively outputting includes multiplexing either of the first or second bits of information from the first or second programmable cells based on receipt of the selection signal, all respectively.

13. The method of claim 11, further comprising the step of programming the first and second programmable cells.

14. A method of outputting data in a semiconductor device, the method comprising:
   providing a plurality of memory cells divided into first and second planes, wherein the first and second planes are not simultaneously active;
   providing first and second electronically programmable resistance cells;
   providing a shared selection circuit coupled to both the first and second programmable cells;
   receiving a selection signal at the shared selection circuit, wherein the selection signal indicates which of the first and second planes are active; and
   selectively outputting either first or second bits of information from the first or second programmable cells based on receipt of the selection signal, all respectively.

15. The method of claim 14 wherein providing first and second electronically programmable cells includes providing first and second antifuses.

16. The method of claim 14 wherein providing first and second electronically programmable cells includes providing first and second fuses.

17. The method of claim 14 wherein selectively outputting includes multiplexing either of the first or second bits of information from the first or second programmable resistance cells based on receipt of the selection signal, all respectively.

18. The method of claim 14, further comprising programming the first and second programmable cells.

19. A method of reading data stored in first and second electronically programmable resistance cells, the method comprising:
   providing a plurality of memory cells divided into first and second planes wherein the first and second planes are not simultaneously active;
   providing a shared output circuit coupled to both the first and second programmable cells;
   receiving a selection signal, wherein the selection signal indicates which of the first and second planes are active; and
   selectively outputting from the shared output circuit either first or second bits of information from the first or second programmable cells based on receipt of the selection signal, all respectively.

20. A data storage and output circuit for a semiconductor memory device having a plurality of memory cells divided into first and second planes, the circuit being coupled to first and second voltage terminals and storing at least two bits of information, the circuit comprising:
   first and second programmable storage means coupled to the first voltage terminal for storing first and second bits of information, respectively;
   a shared selection circuit means coupled to the first and second programmable storage means for providing either the first or second bit of information in response to a selection signal indicating which of the first and second planes is active; and
   an output means coupled to the second voltage supply terminal and coupled to the shared selection circuit means for outputting the first or second bit of information from the shared selection circuit means.

21. The circuit of claim 20 wherein the selection circuit comprises a means for multiplexing.

22. A semiconductor memory device coupled to first and second voltage supply terminals, comprising:
   a plurality of rows and columns of primary and redundant storage means for storing bits of information, the primary and redundant storage means being divided into first and second complementary blocks;
   a plurality of programmable storage means for storing at least one bit of information of an address of one of the plurality of rows of primary storage means and at least one bit of information of an address of one of the plurality of columns of primary storage means, each programmable storage means comprising:
      first and second means for storing data, each means being coupled to the first voltage supply terminal;
      a single shared selection means coupled to both of the first and second means for storing data for selectively providing first and second bits of information stored in the first and second means for storing data in response to a selection signal indicating which of the first and second blocks of memory cells is active; and
      an output means coupled to the second voltage supply terminal and the single shared selection circuit means for providing the first and second bits of information from the single shared selection means.

23. The semiconductor memory device of claim 22 wherein the first and second means for storing data comprise a first means for storing a logic state corresponding to one bit of an address of a defective memory cell in one of the plurality of rows of memory cells, and a second means for storing a logic state corresponding to one bit of an address of a defective memory cell in one of the plurality of columns of memory cells.

24. The semiconductor memory device of claim 22 wherein the single shared selection means comprises a means for multiplexing.

* * * * *